United States Patent [19]
Wu

[11] Patent Number: 6,057,195
[45] Date of Patent: May 2, 2000

[54] METHOD OF FABRICATING HIGH DENSITY FLAT CELL MASK ROM

[75] Inventor: Shye-Lin Wu, Hsinchu, Taiwan

[73] Assignee: Texas Instruments - Acer Incorporated, Hsinchu, Taiwan

[21] Appl. No.: 09/083,609

[22] Filed: May 22, 1998

[51] Int. Cl.[7] .............................................. H01L 21/8246
[52] U.S. Cl. ..................... 438/275; 438/276; 438/278; 438/561; 438/564; 438/589
[58] Field of Search ..................... 438/262, 259, 438/587, 589, 564, 558, 275, 561, 128, 276, 277, 278

[56] References Cited

U.S. PATENT DOCUMENTS

| | | | |
|---|---|---|---|
| 4,679,300 | 7/1987 | Chan et al. | 438/262 |
| 5,429,988 | 7/1995 | Huang et al. | 438/262 |
| 5,675,164 | 10/1997 | Brunner et al. | 438/381 |
| 5,770,484 | 6/1998 | Kleinhenz | 438/155 |
| 5,846,865 | 12/1998 | Shrng et al. | 438/587 |
| 5,866,457 | 2/1999 | Wen | 438/275 |
| 5,937,280 | 8/1999 | Wen | 438/275 |

*Primary Examiner*—Mary Wilczewski
*Assistant Examiner*—Yung A. Lin
*Attorney, Agent, or Firm*—Harness, Dickey & Pierce, P.L.C.

[57] ABSTRACT

A method of fabricating high-density flat cell mask ROM is disclosed. The method comprises, formed a plurality of trenches in a silicon substrate firstly. An oxynitride layer is then grown on resultant surfaces to about 1–5 nm, After refilling a plurality of trenches with a first in-situ phosphorus doping polysilicon layer or amorphous silicon, etching back the polysilicon layer to form a flat surface by a CMP process is achieved. Subsequently, a thermal oxidation process is carried out to grow an oxide layer and to form a plurality of buried bit lines by diffusing the conductive impurities in the polysilicon layer through the oxynitride layer into the silicon substrate. A second in-situ n+ doped polysilicon layer is deposited and patterned as word lines; then a patterned photoresist coated on the second polysilicon layer except predetermining coding regions. Finally, a coding boron implant into the predetermined coding region is done to form normally off transistors.

22 Claims, 7 Drawing Sheets

METHOD OF FABRICATING HIGH DENSITY FLAT CELL MASK ROM

FIELD OF THE INVENTION

The present invention relates to a silicon device process, and more specifically, to a method of fabricating high density flat mask ROM;

BACKGROUND OF THE INVENTION

Recently, to develop very high-density non-volatile semiconductor-memories for using in notebook computers, mobile phones, and portable CD players and so on for replacing the conventional mass storage system draws much attention. One of attractive non-volatile memory is mask ROM (read only memory), which stores predetermined and commonly used information before the chip is encapsulated. Commonly used program or information includes an operating system (OS), a fixed subroutine program, and tables etc., as is stated in U.S. Pat. No. 4,744,054 to K. Kawata et al., issued on May 10, 1988. Generally, most of mask ROM is manufactured with the same basic structure, and be set the thresholds of the channel regions below the gate to the same predetermined value (e.g. 0.2–1 V) i.e. in the predetermined "on" state except those being programmed to "off" state transistor (by raising the thresholds of the MOS transistors). Hence, after receiving an order for a special program from customer, a mask ROM is produced to perform the programming, and to finish production; hence it gives a short turn around time.

Currently, the mask ROM with buried bit lines is one of the popular mask ROMs due to its small dimensions and high density. For examples, as is shown in FIG. 1, a conventional method of fabricating mask ROM in which a polysilicon layer 14 formed on gate insulating layer 15 as word lines, with implanted n+ region 16 as buried bit lines and then using contact holes for final metal interconnection. It is noted that there are many processes to be performed to complete the whole integrated circuit i.e. wafers will undergo several high temperature processes. Each high temperature processes could cause the out diffusion of impurities in area such as buried bit line, so that the spacing between two adjacent buried bit lines will become narrow, and it results in inducing cell punchthrough to occur. In addition, such a mask ROM would be with high resistance in the impurity region 16 (due to impurities out diffusion), and thus cause much difficult to fabricate a high-speed memory. Seung et al., in "U.S. Pat. No. 5,688,661 issued on Nov. 18, 1997," proposed an improved structure wherein a silicide 12 formed on the diffusion buried layer (BN+), and effectively reduces a sheet resistance of a bit line and a contact resistance of source/drain regions, as shown in FIG. 2.

Another method of fabricating a high density flat mask ROM with diffusion buried layer is reported by C. C. Hsue et al., in U.S. Pat. No. 5,668,031 issued on Sep., 16, 1997, as shown in FIG. 3. The dielectric layer 35 is formed at least partially between the source/drain electrode area 38 and the silicon substrate 30, thereby reducing leakage current. Since the structure with a dielectric layer to isolate the silicon substrate and source/drain electrodes and hence, the distance between adjacent source/drain electrodes can be minimized. However, the processes proposed by C. C. Hsue et al., are quite complicate, In processes, multiple steps are demanded to form polysilicon layer and refill the trench, at the same time the native oxide may formed between the interface of polysilicon layers. Furthermore, the feature sizes of mask ROMs are limited by the lithographic technology, hence whether it could apply to form very high-density mask ROM is not known.

SUMMARY OF THE INVENTION

The disadvantages of forgoing prior art either such as causes punch-through issue for narrow space between the adjacent bit lines or require rather complicate processes. Thus in the present invention, a method by using the current lithography technology auxiliary with spacers to define pattern and to fabricate high-density flat cell mask ROM is disclosed. The invention also solves the punchthrough issue between two narrow adjacent bit lines can be minimized due the n+ bit line is formed by diffusing the dopant from the n+ polysilicon through the ultra-thin oxynitride layer into silicon substrate The method comprises following steps: firstly, formed a pad oxide layer on the silicon substrate to about 5–30 nm in thickness, and then deposited a nitride layer on the pad oxide layer. After that, the nitride layer is patterned done to define the predetermined source/drain region, and then an oxide layer is deposited on all surfaces by a CVD technology and then the oxide layer is anisotropic etched back to form spacers on sidewalls of the patterned nitride layer. After removing the patterned nitride layer, the remnant pad oxide layer is also etched back. Subsequently, the silicon substrate is recessed by dry etching process to form a plurality of trench using the thick CVD oxide layer as a hard mask. All oxide spaces are then removed by BOE or diluted HF solution; an oxynitride layer is then grown on all surfaces to about 1–5 nm, at a high temperature and in $N_2O$ or NO ambient. After refilling a plurality of trench with first in-situ phosphorus doping polysilicon layer or amorphous silicon layer, etching back the polysilicon layer to form a flat surface by a CMP process is implemented. Subsequently, a thermal oxidation process is carried out to grow an oxide layer and to form a plurality of buried bit lines by diffusing the conductive impurities in the polysilicon layer through the oxynitride layer into the silicon substrate. A second n+ doped polysilicon layer is deposited and patterned to be as word lines. A patterned photoresist is coated on the second polysilicon layer and the predetermining coding regions is defined. Finally, a boron coding implant into the predetermined coding region is achieved to form the normally off transistor.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

A method of fabricating high-density flat cell mask ROM is disclosed. The detailed processes are illustrated by reference to the drawings, and are described as follows.

Figure 1:
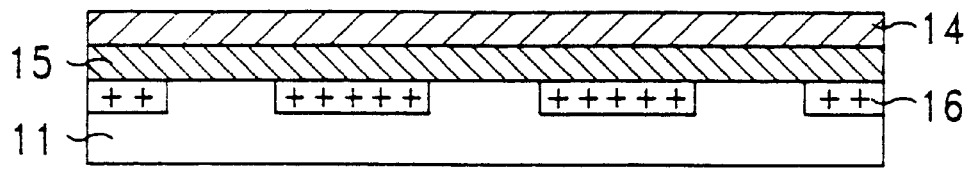
FIG. 1. is a cross-sectional view of a product of mask ROM array with buried bit line region, in accordance with the prior art.
Figure 2:
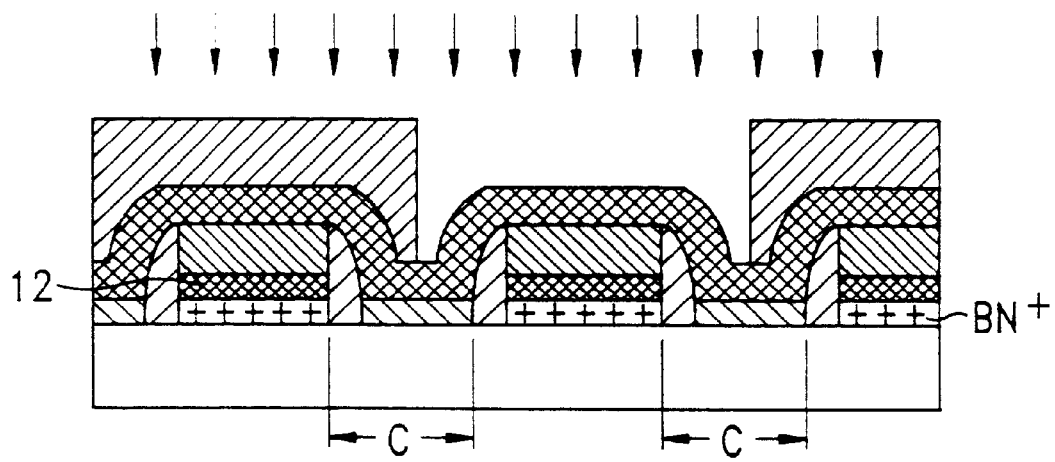
FIG. 2. is a cross-sectional view of a product of manufacturing ROM array with silicide layer over buried bit line structure in accordance with the prior art.
Figure 3:
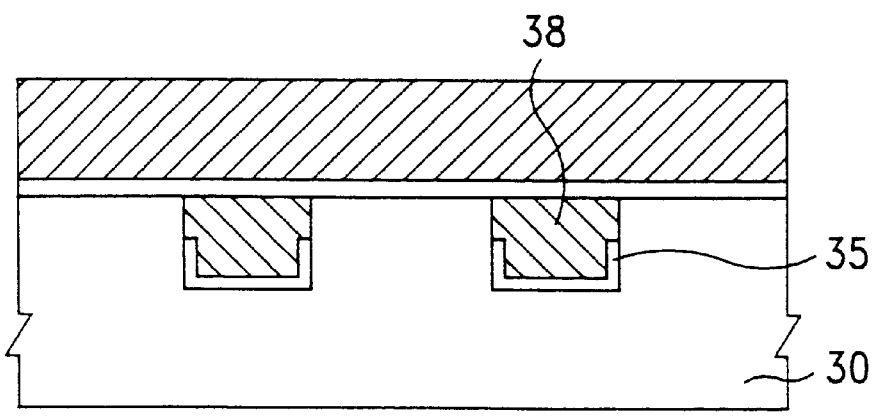
FIG. 3. is a cross-sectional view of a product of manufacturing ROM array with dielectric layer formed partially between the source/drain areas and the silicon substrate in accordance with the present invention.
Figure 4:
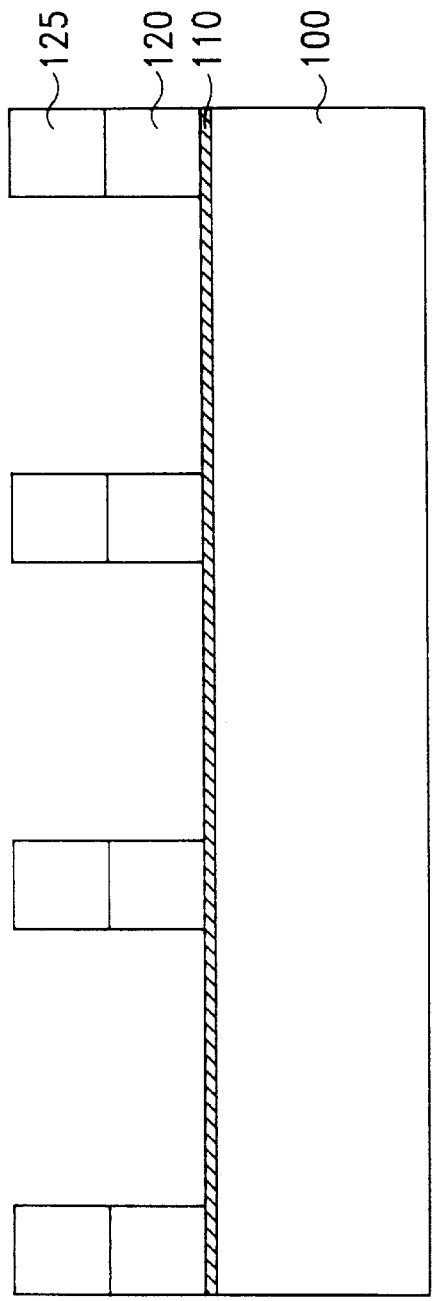
FIG. 4. is a cross-sectional view of patterning nitride layer in accordance with the present invention.

Referring to FIG. 4, a thin pad oxide layer 110 is formed using a CVD method or thermal growing method on a silicon substrate 100. The pad oxide 110 thickness is about 5–30 nm, and then a thick nitride layer is deposited by utilizing a low pressure CVD (LPCVD) or a plasma enhanced CVD technology to about 100–500 nm in thickness. After that, a photoresist pattern 125 via lithography technology is coated on the nitride layer 120, and an etching step is done to define a plurality of predetermined source/drain regions. It is noted that the ratio of spacing between the individual nitride layer 120 to the width of the nitride layers 120 itself is about 3:1. For example, in current lithography, the width of the exposed pad oxide layer 110 and the patterned nitride layer 120 can be narrow to about 160 nm and 55 nm, respectively.

Figure 5:
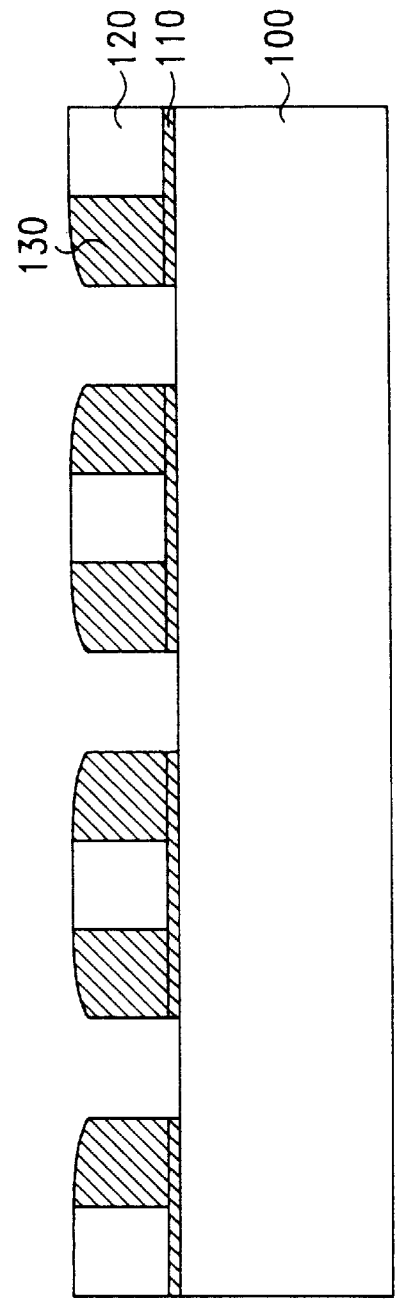
FIG. 5. is a cross-sectional view of depositing a CVD oxide layer, and then etching back to form oxide spacer in accordance with the present invention.

FIG. 5 shows the photoresist layer 125 is removed. and then an insulating layer such as oxide layer is deposited on all areas, and then etching back is carried out using an anisotropic dry etching method to form oxide spacers 130 on sidewalls of the patterned nitride layer 120. Generally, it is best not using the dry etching alone (e.g. plasma etching or reactive ion etching) to expose substrate but by accompanying with a wet etching (e.g. dipped by BOE or diluted HF solution) to alleviate the etching damages.

Figure 6:
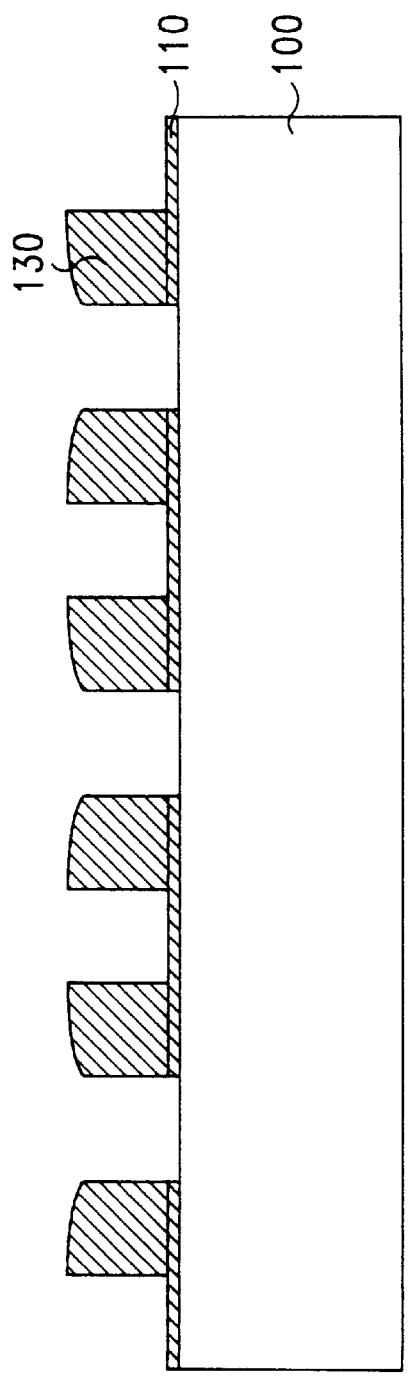
FIG. 6. is a cross-sectional view of removing all nitride layers by hot H3PO4 solution, in accordance with the present invention.
Figure 7:
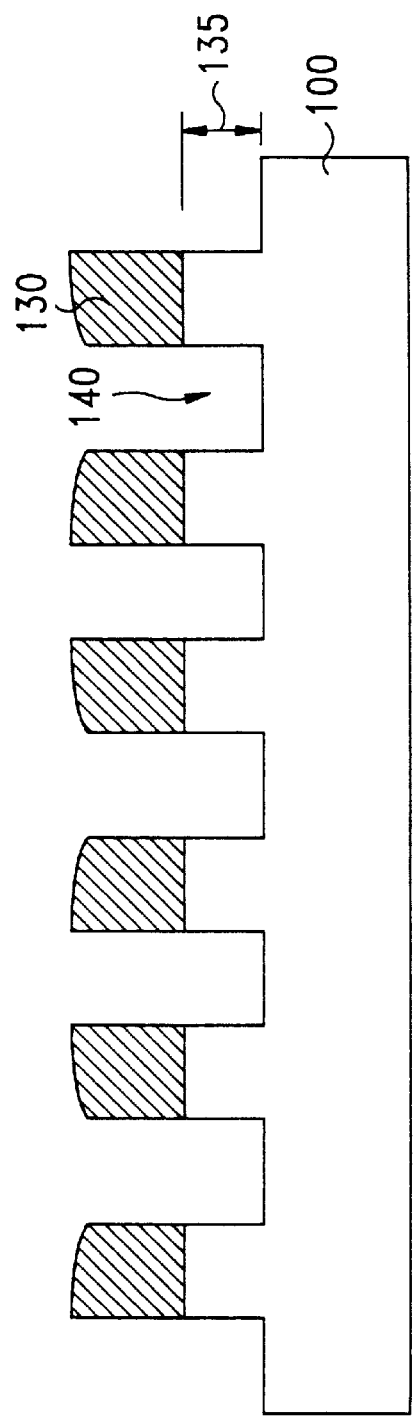
FIG. 7. is a cross-sectional view of slightly etching back the pad oxide layer, and then recessing the silicon substrate using oxide spacer as a hard mask, in accordance with the present invention.

Next as shown in FIG. 6, all patterned nitride layers 120 are removed by hot $H_3PO_4$ solution to exposed pad oxide layer 110. Referring to FIG. 7, BOE or diluted HF solution is used firstly to etch all remnant pad oxide 110 layers. It is noted that a slightly etch back oxide spacer 130 is observed, and then a dry etch using oxide spacers 130 as hard mask to recess the silicon substrate 100 is implemented to form a plurality of trenches 140. Preferably, the removal of portion of silicon to a depth of about 50–500 nm (as is indicated by double arrows 135) is done by a plasma etching method using bromine-based chemistries such as $CF_3Br$, $HBr/NF_3$, for it with extremely high selectively to the oxide mask.

Figure 8:
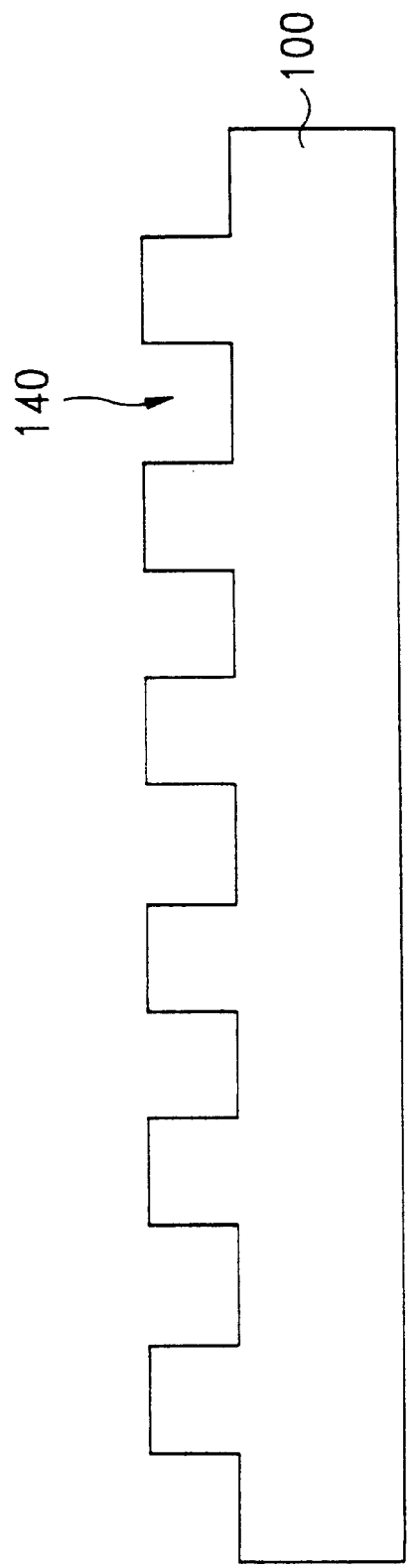
FIG. 8. is a cross-sectional view of removing all oxide layers by BOE or diluted HF solution, in accordance with the present invention.

Subsequently, all oxide spacers 130 is removed to exposed silicon substrate using BOE or diluted HF solution, and then a plurality of shallow trenches 140 is observed, the results is shown in FIG. 8.

Figure 9:
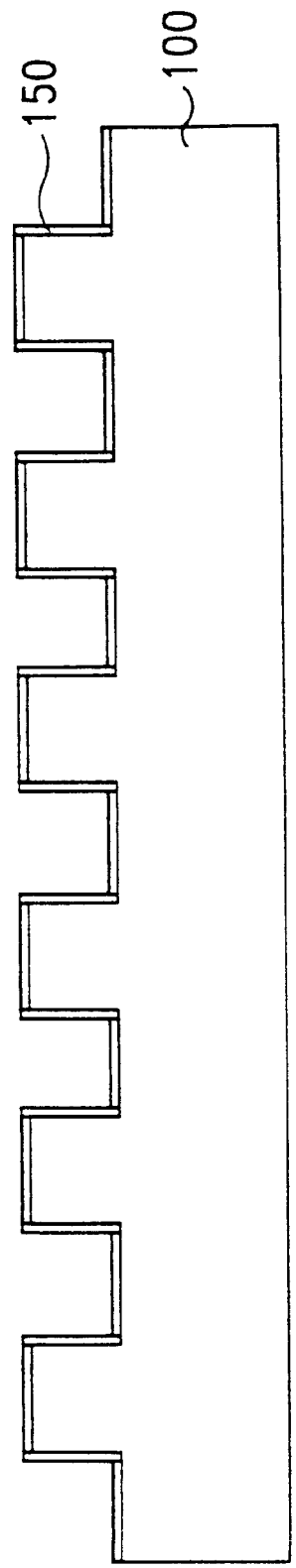
FIG. 9. is a cross-sectional view of performing thermal oxidation in $N_2O$ or NO ambient to grow an ultra-thin oxynitride layer on all surfaces, in accordance with the present invention.

Referring to FIG. 9, a thermal oxidation process at a temperature of about 700–1150° C. in $N_2O$ or NO ambient is done to grow an ultra-thin (about 1–5 nm in thickness) oxynitride layer 150 on the resultant silicon substrate. The ultra-thin oxynitride can be used to recover the etching damage. In addition, the growth rate of the oxynitride 150 is slow; hence the thickness and conformity are well under-controlled.

Figure 10A:
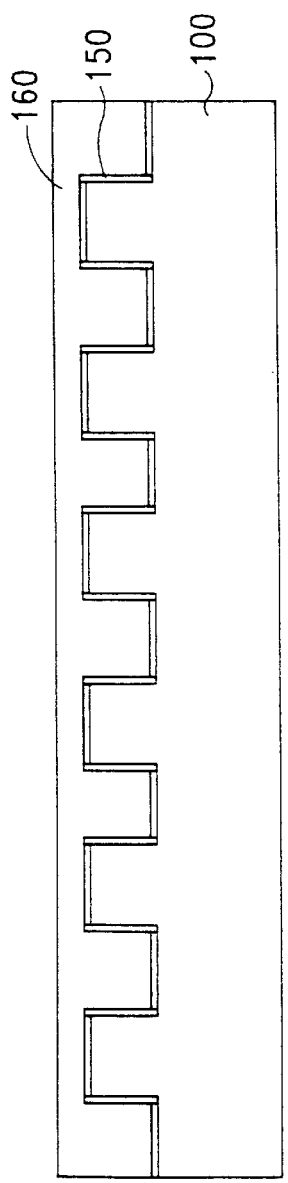
FIG. 10. is a cross-sectional view of refilling all trenches with n+ doped polysilicon or $\alpha$-Si (FIG. 10a) and then etching back by a CMP process (FIG. 10b), in accordance with the present invention.
Figure 10B:
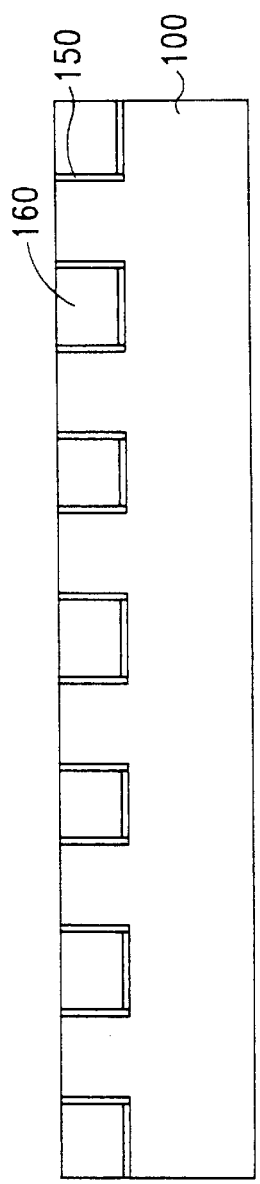

Please turn to FIG. 10a, an in-situ n-type doped polysilicon layer or an amorphous silicon ($\alpha$-Si) layer 160 is deposited to refill the shallow trenches 140. To deposit the $\alpha$-Si layer 160, the method such as a LPCVD or a PECVD can be used (operate at temperature about 400–560 or 250–400° C., respectively). However, to deposit the polysilicon layer 160, a higher temperature process (operate at temperatures of about 560–650° C.) such as a LPCVD is required. Which kind of silicon layer types being selected relies on the trench width (for an example, to refill the trench for 0.1–0.2 $\mu$m width, $\alpha$-Si is prefer, but for 0.25 $\mu$m or above, the material can be poly-Si or $\alpha$-Si). In a preferred embodiment, the phosphorus in-situ doping is preferred, and the concentration is come up to about $5 \times 10^{19}$–$5 \times 10^{21}$ /cm$^3$. Thereafter, as shown in FIG. 10b a chemical/mechanical polish (CMP) process using the oxynitride layer 150 as a CMP stopping layer is achieved to form a flat surface.

Figure 11:
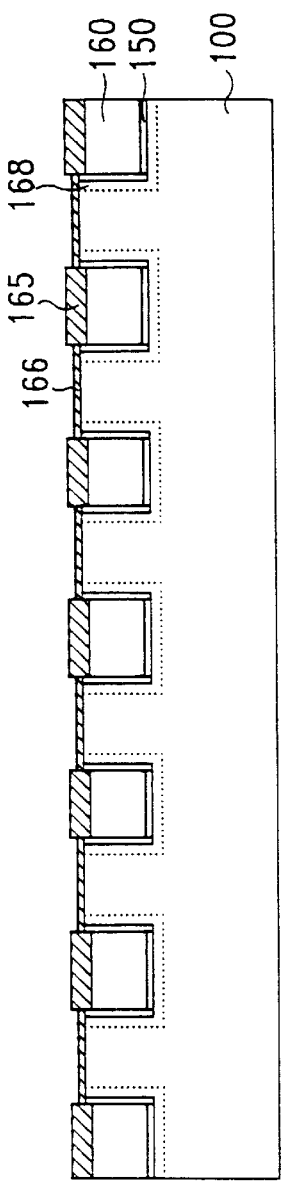
FIG. 11. is a cross-sectional view of performing thermal oxidation to grow a thin gate oxide and form the n+ buried bit lines, in accordance with the present invention.

Referring to FIG. 11, a thermal oxidation process is performed to grow a thin pad oxide layer on the flat surface. In a preferred embodiment, the thermal process is done at a high temperature of about 700–1100° C. for 5–60 min. It is noted that the n+ doped polysilicon 160 having grain boundaries to provide $O_2$ fast diffusing path. Furthermore, the doped impurities in the polysilicon 160 can assist the oxidation rate too. Therefore, the thickness of the pad oxide layers (the thick portion layer 165) on the n+ doped polysilicon (or $\alpha$-Si) 160 is expected distinctly larger than that of on the silicon substrate 110 (the thin portion layer 166). The thickness of the pad oxide layers (165 and 166) is measured to be about 5–15 nm and 15–50 nm, respectively. In the thermal process, the high impurity concentration gradient between n+ doped polysilicon 160 and its surroundings will drive the dopants from the n+ doped polysilicon 160 through the ultra-thin oxynitride layer 150 into the silicon substrate 110 to form the buried bit lines 168. It is noted that the diffused doping profile varies with the thickness of the oxynitride layer 150. The thicker of the oxynitride layer 150, the shorter distance of impurities can diffuse. Generally, for impurities can diffuse through the oxynitride layer 150, the thickness of oxynitride layer 150 ought to be thinner than 5 nm.

Figure 12:
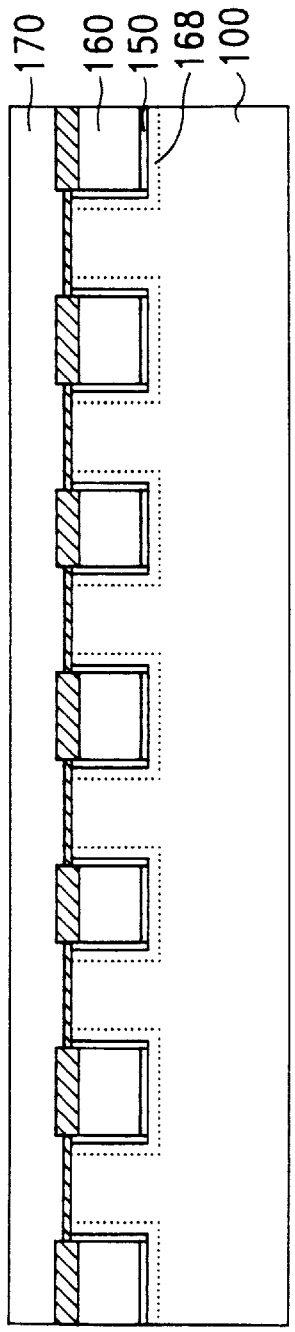
FIG. 12. is a cross-sectional view of depositing second n+ polysilicon as word lines, in accordance with present invention.

Referring to FIG. 12, another n+ polysilicon layer 170 is deposited on all areas, and patterned to defined word lines. In a preferred embodiment, a CVD method, such as LPCVD is performed at a temperature of about 500–620° C., and the doping concentration is come up to about $5 \times 10^{19}$–$5 \times 10^{21}$/cm$^3$.

Figure 13:
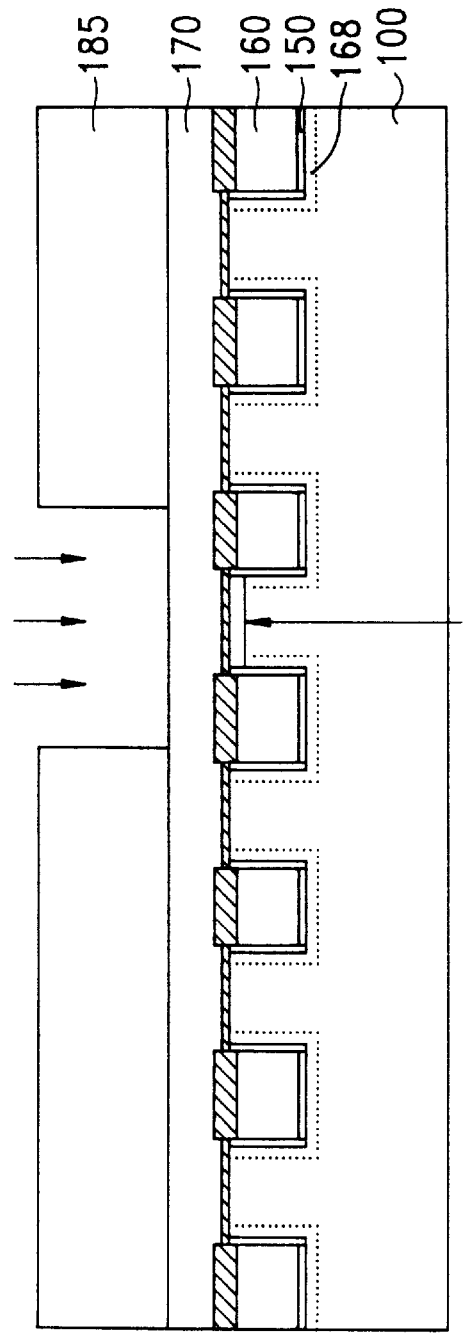
FIG. 13. is a cross-sectional view of performing a coding implant into the predetermined region using a patterned photoresist layer as a mask, in accordance with present invention.

Finally, as shown in FIG. 13, a next photoresist 185 is coated so as to define the predetermined coding region 148. For the purpose to increase the threshold voltage of the coding region 148 so as to form normally off mask ROM. A $BF_2^+$ or $B^+$ implantation through n+ polysilicon layer 170 into substrate to form the coding region 180 is carried out using photoresist 185 as a mask. In a preferred embodiment, the boron ion implantation is used, and the dosage and energy are about $5\times10^{11}$–$5\times10^{14}$ /cm$^2$ and about 80 to 300 keV respectively.

Figure 14:
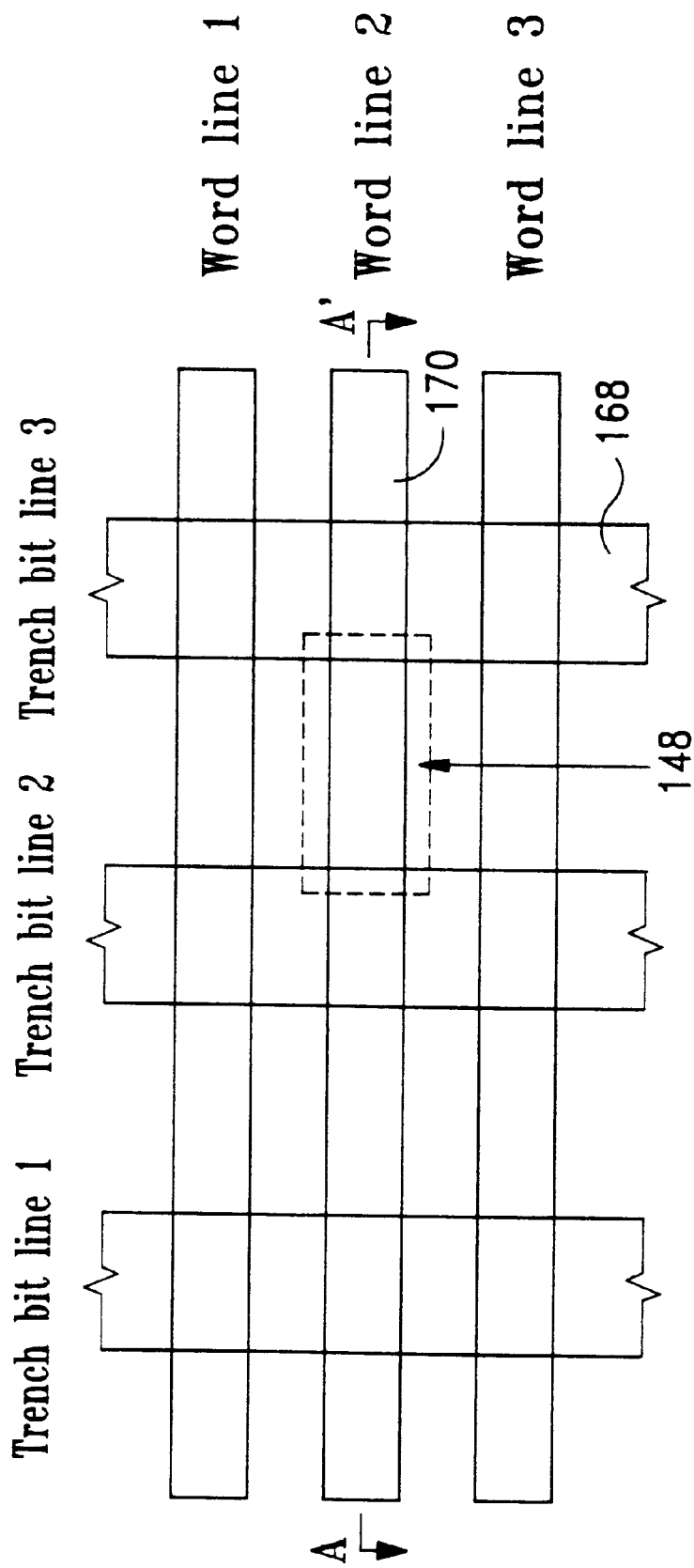
FIG. 14. is a top view of high density NAND type flat cell mask ROM in accordance with the present invention.

FIG. 14 is a top-view diagram illustrating the high density of flat cell NAND gate mask ROM, wherein the source/drain regions are bit lines 168, and the polysilicon gate 170 are word lines. In addition, the rectangle of dotted line 148 indicates a coding region. The view along the word line A—A', gives the cross-section of NAND gate mask ROM as depicted in FIGS. 4–13.

The benefits of this invention are (1) a very high density flat cell mask ROM can be achieved by using the current lithography technology auxiliary with spacers to define pattern (the conventional method all demand the lithography technology to define the find pattern); and (2) the punchthrough issue between two narrow adjacent bit lines can be minimized due the n+ bit line is formed by diffusing the dopant from the n+ polysilicon through the ultra-thin oxynitride layer 150 into silicon substrate. (The thickness of oxynitride layer 150 can be well under-controlled, so does the impurity diffusion distance.)

As is understood by a person skilled in the art, the foregoing preferred embodiment of the present invention is an illustration of the present invention rather than limiting thereon. It is intended to cover various modifications and similar arrangements included within the spirit and scope of the appended claims, the scope of which should be accorded the broadest interpretation so as to encompass all such modifications and similar structure.

While the preferred embodiment of the invention has been illustrated and described, it will be appreciated that various changes can be made therein without departing from the spirit and scope of the invention.

What is claimed is:

1. A method of fabricating flat cell mask ROM on a silicon substrate comprising the steps of:
    forming a plurality of trenches in said silicon substrate;
    forming an oxynitride layer on resultant surfaces of said silicon substrate;
    forming a first silicon layer with first conductivity type impurities doping to refill said a plurality of trenches;
    etching back said silicon layer to form a flat surface using said oxynitride as an etching stopping layer;
    performing thermal oxidation process to grow an oxide layer on said flat surface and to form a plurality of buried bit lines by diffusing said conductive impurities in said polysilicon layer through the oxynitride layer into said silicon substrate; and
    forming a second silicon layer on said oxide layer with first conductivity type impurities doping to form word lines.

2. The method of claim 1 and further comprising the steps of:
    coating a photoresist on said second silicon layer to define predetermining coding regions; and
    implanting said predetermined coding region by second conductivity type impurities opposite said first conductivity type impurities.

3. The method of claim 1, wherein said step of forming a plurality of trenches further comprises the steps of:
    forming a pad oxide layer on said silicon substrate;
    forming a nitride layer on said pad oxide;
    patterning said nitride layer;
    forming spacers on sidewalls of said patterned nitride layer;
    removing said patterned nitride layer;
    etching back all remnant said pad oxide layers; and
    etching said silicon substrate so as to form a plurality of trenches in said silicon substrate using said insulating layer as a hard mask.

4. The method of claim 3, wherein said nitride layer is deposited to a thickness of about 100–500 nm at a temperature about 300–800° C. by a method selected from a group comprising LPCVD and PECVD.

5. The method of claim 3, wherein said step of patterning said nitride layer comprises the steps of forming a photoresist pattern via lithography technology on said nitride layer and etching portions of said nitride layer which is not masked by said photoresist pattern.

6. The method of claim 3, wherein said step of forming spacers comprises the steps of forming an insulating layer on all surfaces and performing an anisotropic etching said insulating layer.

7. The method of claim 6, wherein said insulating layer is an oxide layer.

8. The method of claim 3, wherein said step of removing patterned nitride layer is achieved by hot $H_3PO_4$ solution, said step of etching back all remnant said pad oxide layers is done by a method selected from the group consisting of dilute HF and BOE.

9. The method of claim 3, wherein said step of etching said silicon substrate is carried out to a depth of about 50–500 nm by a plasma etching method using bromine-based chemistries consisting of $CF_3Br$ and $HBr/NF_3$.

10. The method of claim 1, wherein said oxynitride layer is formed to a thickness of about 1–5 nm at a temperature about 750–1150° C. in an ambient selected from the group comprising $N_2O$ and NO.

11. The method of claim 1, wherein said first conductivity type impurities is selected from the group consisting of arsenic containing dopants and phosphorus containing dopants.

12. The method of claim 1, wherein said step of performing thermal oxidation process to grow an oxide layer on said flat surface is implementedt a temperature about 750–1100° C. to thickness of 15–50 nm and 5–15 nm on said surface of first silicon layer and said silicon substrate, respectively.

13. The method of claim 1, wherein said step of forming a flat surface is done by a method comprising a CMP process.

14. The method of claim 2, wherein said step of implanting said predetermined coding region by second conductivity type impurities, said second conductivity type impurities is boron ions with an energy of about 80–300 keV and a dosage of about $5\times10^{11}$–$5\times10^{14}$ /cm$^2$.

15. A method of fabricating flat cell mask ROM on a silicon substrate comprising the steps of
    forming a pad oxide layer on said silicon substrate;
    forming a nitride layer on said pad oxide;
    patterning said nitride layer;
    forming an insulating layer on all surfaces of said silicon substrate;
    performing an anisotropic etching said insulating layer to form spacers on sidewalls of said patterned nitride layer;

removing said patterned nitride layer;

etching back all remnant said pad oxide layers;

etching said silicon substrate so as to form a plurality of trenches in said silicon substrate using said insulating layer as a hard mask;

removing all said spaces;

forming an oxynitride layer on all surfaces;

forming a first silicon layer with conductive impurities to refill said a plurality of trenches;

etching back said polysilicon layer;

performing thermal oxidation process to grow an oxide layer on said flat surface and to form a plurality of buried bit lines by diffusing said conductive impurities in said polysilicon layer through the oxynitride layer into said silicon substrate;

forming a second silicon layer with conductive impurities on said oxide layer;

patterning said second polysilicon layer to form word lines;

coating a photoresist on said second silicon layer to define a predetermining coding region, said predetermining coding region; and implanting said predetermined coding region.

16. The method of claim 15, wherein said nitride layer is deposited to a thickness of about 100–500 nm at a temperature about 400–800° C. by a method selected from the group comprising of LPCVD and PECVD.

17. The method of claim 15, wherein said step of etching said silicon substrate is carried out to a depth of about 50–500 nm which is measured from the upper surface of said silicon substrate to the bottom of trench by a dry etching method.

18. The method of claim 15, wherein said first conductivity type impurities is selected from the group consisting of arsenic containing dopants and phosphorus containing dopants.

19. The method of claim 15, wherein said step of performing thermal oxidation process to grow an oxide layer on said flat surface is implement at a temperature about 750–1100° C. to thickness of 15–50 nm and 5–15 nm on said surface of first silicon layer and said silicon substrate, respectively.

20. The method of claim 15, wherein said step of implanting said predetermined coding region by second conductivity type impurities, said second conductivity type impurities is boron ions with an energy of about 80–300 keV and a dosage of about $5 \times 10^{11}$–$5 \times 10^{14}$ /cm$^2$.

21. The method of claim 15, wherein said oxynitride layer is formed to a thickness of about 1–5 nm at a temperature about 750–1150° C. in an ambient selected from the group comprising $N_2O$ and NO.

22. The method of claim 15, wherein said second silicon layer comprises a polysilicon layer.

* * * * *